US006340904B1

(12) United States Patent
Manning

(10) Patent No.: US 6,340,904 B1
(45) Date of Patent: *Jan. 22, 2002

(54) METHOD AND APPARATUS FOR GENERATING AN INTERNAL CLOCK SIGNAL THAT IS SYNCHRONIZED TO AN EXTERNAL CLOCK SIGNAL

(75) Inventor: Troy A. Manning, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/317,059

(22) Filed: May 24, 1999

Related U.S. Application Data

(63) Continuation of application No. 08/798,226, filed on Feb. 11, 1997, now Pat. No. 5,940,608.

(51) Int. Cl.[7] ................................................. H03L 7/06

(52) U.S. Cl. ...................................................... 327/156

(58) Field of Search .......................... 327/141, 144–148, 327/150–152, 155–157, 159, 160, 163; 331/DIG. 2; 395/558, 552, 551, 555

(56) References Cited

U.S. PATENT DOCUMENTS

| | | | |
|---|---|---|---|
| 3,633,174 A | 1/1972 | Griffin | 340/172.5 |
| 4,077,016 A | 2/1978 | Sanders et al. | 331/4 |
| 4,096,402 A | 6/1978 | Schroeder et al. | 307/362 |
| 4,404,474 A | 9/1983 | Dingwall | 307/260 |
| 4,481,625 A | 11/1984 | Roberts et al. | 370/85 |
| 4,508,983 A | 4/1985 | Allgood et al. | 307/577 |

(List continued on next page.)

FOREIGN PATENT DOCUMENTS

| | | |
|---|---|---|
| EP | 0 295 515 A1 | 12/1988 |
| EP | 0 406 786 A1 | 1/1991 |
| EP | 0 450 871 A2 | 10/1991 |

(List continued on next page.)

OTHER PUBLICATIONS

Alvarez, J. et al. "A Wide–Bandwidth Low Voltage PLL for PowerPC ™ Microprocessors" IEEE IEICE Trans. Electron., vol. E–78. No. 6, Jun. 1995, pp. 631–639.

Anonymous, "400MHz SLDRAM, 4M X 16 SLDRAM Pipelined, Eight Bank, 2.5 V Operation," SLDRAM Consortium Advance Sheet, published throughout the United States, pp. 1–22.

(List continued on next page.)

Primary Examiner—My-Trang Nu Ton
(74) Attorney, Agent, or Firm—Dorsey & Whitney LLP

(57) ABSTRACT

A clock generator circuit for an integrated circuit includes a phase detector comparing the phase of a delayed external clock signal to the phase of an internal clock signal. An error signal corresponding to the difference in phase between the two clock signals is applied to a differential amplifier where the error signal is offset by a value corresponding to the delay of an external clock signal as it is coupled to the phase detector. The offset error signal is applied to a control input of a voltage controlled oscillator which generates the internal clock signal. The phase of the internal clock signal it thus adjusted so that it is substantially the same as the phase of the external clock signal before being delayed as it is coupled to the phase detector and other circuitry in the integrated circuit. The voltage controlled oscillator is constructed to operate in a plurality of discrete frequency bands so that the offset error signal need only control the frequency of the internal clock signal over a relatively small range. The frequency band is selected by a signal from a register that is programmed by a user with data identifying the frequency of the external clock signal.

23 Claims, 3 Drawing Sheets

U.S. PATENT DOCUMENTS

| | | | |
|---|---|---|---|
| 4,511,846 A | 4/1985 | Nagy et al. | 328/164 |
| 4,514,647 A | 4/1985 | Shoji | 307/269 |
| 4,524,448 A | 6/1985 | Hullwegen | 375/118 |
| 4,573,017 A | 2/1986 | Levine | 328/155 |
| 4,600,895 A | 7/1986 | Landsman | 331/1 A |
| 4,603,320 A | 7/1986 | Farago | 340/347 |
| 4,638,187 A | 1/1987 | Boler et al. | 307/451 |
| 4,638,451 A | 1/1987 | Hester et al. | 364/900 |
| 4,687,951 A | 8/1987 | McElroy | 307/269 |
| 4,773,085 A | 9/1988 | Cordell | 375/120 |
| 4,789,796 A | 12/1988 | Foss | 307/443 |
| 4,818,995 A | 4/1989 | Takahashi et al. | 341/94 |
| 4,885,554 A * | 12/1989 | Wimmer | 331/25 |
| 4,893,087 A | 1/1990 | Davis | 328/14 |
| 4,902,986 A | 2/1990 | Lesmeister | 331/25 |
| 4,953,128 A | 8/1990 | Kawai et al. | 365/194 |
| 4,958,088 A | 9/1990 | Farah-Bakhsh et al. | 307/443 |
| 4,972,470 A | 11/1990 | Farago | 380/3 |
| 4,984,204 A | 1/1991 | Sato et al. | 365/189.11 |
| 5,020,023 A | 5/1991 | Smith | 364/900 |
| 5,038,115 A | 8/1991 | Myers et al. | 331/2 |
| 5,075,569 A | 12/1991 | Branson | 307/270 |
| 5,086,500 A | 2/1992 | Greub | 395/550 |
| 5,087,828 A | 2/1992 | Sato et al. | 307/269 |
| 5,122,690 A | 6/1992 | Bianchi | 307/475 |
| 5,128,560 A | 7/1992 | Chern et al. | 307/475 |
| 5,128,563 A | 7/1992 | Hush et al. | 307/482 |
| 5,134,311 A | 7/1992 | Biber et al. | 307/270 |
| 5,150,186 A | 9/1992 | Pinney et al. | 357/42 |
| 5,165,046 A | 11/1992 | Hesson | 307/270 |
| 5,179,298 A | 1/1993 | Hirano et al. | 307/443 |
| 5,194,765 A | 3/1993 | Dunlop et al. | 307/443 |
| 5,212,601 A | 5/1993 | Wilson | 360/51 |
| 5,220,208 A | 6/1993 | Schenck | 307/443 |
| 5,223,755 A | 6/1993 | Richley | 307/603 |
| 5,233,314 A | 8/1993 | McDermott et al. | 331/17 |
| 5,233,564 A | 8/1993 | Ohshima et al. | 365/230.05 |
| 5,239,206 A | 8/1993 | Yanai | 307/272.2 |
| 5,243,703 A | 9/1993 | Farmwald et al. | 395/325 |
| 5,254,883 A | 10/1993 | Horowitz et al. | 307/443 |
| 5,256,989 A | 10/1993 | Parker et al. | 331/1 A |
| 5,257,294 A | 10/1993 | Pinto et al. | 375/94 |
| 5,268,639 A | 12/1993 | Gasbarro et al. | 324/158 R |
| 5,272,729 A | 12/1993 | Bechade et al. | 375/118 |
| 5,274,276 A | 12/1993 | Casper et al. | 307/443 |
| 5,276,642 A | 1/1994 | Lee | 365/189.04 |
| 5,278,460 A | 1/1994 | Casper | 307/296.5 |
| 5,281,865 A | 1/1994 | Yamashita et al. | 307/279 |
| 5,283,631 A | 2/1994 | Koerner et al. | 307/451 |
| 5,289,580 A | 2/1994 | Latif et al. | 395/275 |
| 5,295,164 A | 3/1994 | Yamamura | 375/120 |
| 5,304,952 A | 4/1994 | Quiet et al. | 331/1 A |
| 5,311,481 A | 5/1994 | Casper et al. | 365/230.06 |
| 5,311,483 A | 5/1994 | Takasugi | 365/233 |
| 5,313,431 A | 5/1994 | Uruma et al. | 365/230.05 |
| 5,315,388 A | 5/1994 | Shen et al. | 348/718 |
| 5,321,368 A | 6/1994 | Hoelzle | 328/63 |
| 5,337,285 A | 8/1994 | Ware et al. | 365/227 |
| 5,341,405 A | 8/1994 | Mallard, Jr. | 375/120 |
| 5,347,177 A | 9/1994 | Lipp | 307/443 |
| 5,347,179 A | 9/1994 | Casper et al. | 307/451 |
| 5,355,391 A | 10/1994 | Horowitz et al. | 375/36 |
| 5,361,002 A | 11/1994 | Casper | 327/530 |
| 5,367,649 A | 11/1994 | Cedar | 395/375 |
| 5,379,299 A | 1/1995 | Schwartz | 370/108 |
| 5,390,308 A | 2/1995 | Ware et al. | 395/400 |
| 5,400,283 A | 3/1995 | Raad | 365/203 |
| 5,402,389 A | 3/1995 | Flannagan et al. | 365/233 |
| 5,408,640 A | 4/1995 | MacIntyre et al. | 395/550 |
| 5,410,263 A | 4/1995 | Waizman | 327/141 |
| 5,416,436 A | 5/1995 | Rainard | 327/270 |
| 5,416,909 A | 5/1995 | Long et al. | 395/827 |
| 5,420,544 A | 5/1995 | Ishibashi | 331/11 |
| 5,428,311 A | 6/1995 | McClure | 327/276 |
| 5,428,317 A | 6/1995 | Sanchez et al. | 331/1 A |
| 5,430,408 A | 7/1995 | Ovens et al. | 327/404 |
| 5,430,676 A | 7/1995 | Ware et al. | 365/189.02 |
| 5,432,823 A | 7/1995 | Gasbarro et al. | 375/356 |
| 5,438,545 A | 8/1995 | Sim | 365/189.05 |
| 5,440,260 A | 8/1995 | Hayashi et al. | 327/278 |
| 5,440,514 A | 8/1995 | Flannagan et al. | 365/194 |
| 5,444,667 A | 8/1995 | Obara | 365/233 |
| 5,446,696 A | 8/1995 | Ware et al. | 365/222 |
| 5,448,193 A | 9/1995 | Baumert et al. | 327/156 |
| 5,451,898 A | 9/1995 | Johnson | 327/563 |
| 5,457,407 A | 10/1995 | Shu et al. | 326/30 |
| 5,465,076 A | 11/1995 | Yamauchi et al. | 331/179 |
| 5,473,274 A | 12/1995 | Reilly et al. | 327/159 |
| 5,473,575 A | 12/1995 | Farmwald et al. | 365/230.06 |
| 5,473,639 A | 12/1995 | Lee et al. | 375/376 |
| 5,485,490 A | 1/1996 | Leung et al. | 375/371 |
| 5,488,321 A | 1/1996 | Johnson | 327/66 |
| 5,489,864 A | 2/1996 | Ashuri | 327/161 |
| 5,497,127 A | 3/1996 | Sauer | 331/17 |
| 5,498,990 A | 3/1996 | Leung et al. | 327/323 |
| 5,500,808 A | 3/1996 | Wang | 365/578 |
| 5,506,814 A | 4/1996 | Hush et al. | 365/230.03 |
| 5,508,638 A | 4/1996 | Cowles et al. | 326/38 |
| 5,513,327 A | 4/1996 | Farmwald et al. | 395/309 |
| 5,532,714 A | 7/1996 | Knapp et al. | 345/114 |
| 5,539,345 A | 7/1996 | Hawkins | 327/150 |
| 5,544,124 A | 8/1996 | Zagar et al. | 365/230.08 |
| 5,544,203 A | 8/1996 | Casasanta et al. | 375/376 |
| 5,552,727 A | 9/1996 | Nakao | 327/159 |
| 5,555,429 A | 9/1996 | Parkinson et al. | 395/800 |
| 5,557,781 A | 9/1996 | Stones et al. | 395/550 |
| 5,563,546 A | 10/1996 | Tsukada | 327/408 |
| 5,568,075 A | 10/1996 | Curran et al. | 327/172 |
| 5,568,077 A | 10/1996 | Sato et al. | 327/199 |
| 5,572,557 A | 11/1996 | Aoki | 375/376 |
| 5,572,722 A | 11/1996 | Vogley | 395/555 |
| 5,574,698 A | 11/1996 | Raad | 365/230.06 |
| 5,576,645 A | 11/1996 | Farwell | 327/94 |
| 5,577,236 A | 11/1996 | Johnson et al. | 395/551 |
| 5,578,940 A | 11/1996 | Dillon et al. | 326/30 |
| 5,578,941 A | 11/1996 | Sher et al. | 326/34 |
| 5,579,326 A | 11/1996 | McClure | 371/61 |
| 5,581,197 A | 12/1996 | Motley et al. | 326/30 |
| 5,589,788 A | 12/1996 | Goto | 327/276 |
| 5,590,073 A | 12/1996 | Arakawa et al. | 365/185.08 |
| 5,594,690 A | 1/1997 | Rothenberger et al. | 365/189.01 |
| 5,614,855 A | 3/1997 | Lee et al. | 327/158 |
| 5,619,473 A | 4/1997 | Hotta | 365/238.5 |
| 5,621,340 A | 4/1997 | Lee et al. | 327/65 |
| 5,621,690 A | 4/1997 | Jungroth et al. | 365/200 |
| 5,621,739 A | 4/1997 | Sine et al. | 371/22.1 |
| 5,627,780 A | 5/1997 | Malhi | 365/185.09 |
| 5,627,791 A | 5/1997 | Wright et al. | 365/222 |
| 5,631,872 A | 5/1997 | Naritake et al. | 365/227 |
| 5,636,163 A | 6/1997 | Furatani et al. | 365/189.01 |
| 5,636,173 A | 6/1997 | Schaefer | 365/230.03 |
| 5,636,174 A | 6/1997 | Rao | 365/230.03 |
| 5,638,335 A | 6/1997 | Akiyama et al. | 365/230.03 |
| 5,646,904 A | 7/1997 | Ohno et al. | 365/233 |
| 5,652,530 A | 7/1997 | Ashuri | 326/93 |
| 5,657,289 A | 8/1997 | Hush et al. | 365/230.05 |
| 5,657,481 A | 8/1997 | Farmwald et al. | 395/551 |
| 5,663,921 A | 9/1997 | Pascucci et al. | 365/233 |
| 5,666,322 A | 9/1997 | Conkle | 365/233 |
| 5,668,763 A | 9/1997 | Fujioka et al. | 365/200 |
| 5,668,774 A | 9/1997 | Furutani | 365/233 |

| | | | |
|---|---|---|---|
| 5,675,274 A | 10/1997 | Kobayashi et al. | 327/158 |
| 5,692,165 A | 11/1997 | Jeddeloh et al. | 395/551 |
| 5,694,065 A | 12/1997 | Hamasaki et al. | 327/108 |
| 5,708,611 A | 1/1998 | Iwamoto | 365/195 |
| 5,712,580 A | 1/1998 | Baumgartner et al. | 327/12 |
| 5,719,508 A | 2/1998 | Daly | 327/12 |
| 5,740,123 A | 4/1998 | Uchida | 365/233 |
| 5,751,665 A | 5/1998 | Tanoi | 368/120 |
| 5,767,715 A | 6/1998 | Marquis et al. | 327/159 |
| 5,768,177 A | 6/1998 | Sakuragi | 365/194 |
| 5,774,699 A | 6/1998 | Nagae | 395/551 |
| 5,778,214 A | 7/1998 | Taya et al. | 395/551 |
| 5,781,499 A | 7/1998 | Koshikawa | 365/233 |
| 5,784,422 A | 7/1998 | Heermann | 375/355 |
| 5,789,947 A | 8/1998 | Sato | 327/3 |
| 5,790,612 A | 8/1998 | Chengson et al. | 375/373 |
| 5,794,020 A | 8/1998 | Tanaka et al. | 395/552 |
| 5,805,931 A | 9/1998 | Morzano et al. | 395/884 |
| 5,812,619 A | 9/1998 | Runaldue | 375/376 |
| 5,822,314 A | 10/1998 | Chater-Lea | 370/337 |
| 5,831,929 A | 11/1998 | Manning | 365/233 |
| 5,841,707 A | 11/1998 | Cline et al. | 365/194 |
| 5,852,378 A | 12/1998 | Keeth | 327/171 |
| 5,872,959 A | 2/1999 | Nguyen | 395/552 |
| 5,889,829 A | 3/1999 | Chiao et al. | 375/376 |
| 5,898,242 A | 4/1999 | Peterson | 327/278 |
| 5,898,674 A | 4/1999 | Mawhinney et al. | 370/247 |
| 5,917,760 A | 6/1999 | Millar | 365/194 |
| 5,920,518 A | 7/1999 | Harrison et al. | 365/233 |
| 5,926,047 A | 7/1999 | Harrison | 327/159 |
| 5,926,436 A | 7/1999 | Toda et al. | 365/236 |
| 5,940,609 A | 8/1999 | Harrison | 395/558 |
| 5,946,244 A | 8/1999 | Manning | 365/194 |
| 5,953,284 A | 9/1999 | Baker et al. | 365/233 |
| 5,964,884 A | 10/1999 | Partovi et al. | 713/503 |
| 5,990,719 A | 11/1999 | Dai et al. | 327/244 |
| 6,005,823 A | 12/1999 | Martin et al. | 365/230.08 |
| 6,011,732 A | 1/2000 | Harrison et al. | 365/194 |
| 6,016,282 A | 1/2000 | Keeth | 365/233 |
| 6,026,050 A | 2/2000 | Baker et al. | 365/233 |
| 6,029,250 A | 2/2000 | Keeth | 713/400 |
| 6,038,219 A | 3/2000 | Mawhinney et al. | 370/242 |
| 6,067,592 A | 5/2000 | Farmwald et al. | 710/104 |
| 6,101,152 A | 8/2000 | Farmwald et al. | 365/233 |
| 6,101,197 A | 8/2000 | Keeth et al. | 370/517 |
| 6,105,157 A | 8/2000 | Miller | 714/744 |
| 6,147,905 A | 11/2000 | Seino | 365/185.11 |
| 6,147,916 A | 11/2000 | Ogura | 365/203 |
| 6,160,423 A | 12/2000 | Haq | 327/41 |

FOREIGN PATENT DOCUMENTS

| | | |
|---|---|---|
| EP | 0 476 585 A3 | 3/1992 |
| EP | 0 655 741 A2 | 5/1995 |
| EP | 0 655 834 A1 | 5/1995 |
| EP | 0 680 049 A2 | 11/1995 |
| EP | 0 703 663 A1 | 3/1996 |
| EP | 0 704 848 A3 | 4/1996 |
| EP | 0 704 975 A1 | 4/1996 |
| EP | 0 767 538 A1 | 4/1997 |
| JP | 6-1237512 | 10/1986 |
| JP | 2-112317 | 4/1990 |
| JP | 4-135311 | 5/1992 |
| JP | 5-136664 | 6/1993 |
| JP | 5-282868 | 10/1993 |
| JP | 0-7319577 | 12/1995 |
| WO | WO 94/29871 | 12/1994 |
| WO | WO 95/22200 | 8/1995 |
| WO | WO 95/22206 | 8/1995 |
| WO | WO 96/10866 | 4/1996 |
| WO | WO 97/14289 | 4/1997 |
| WO | WO 97/42557 | 11/1997 |

OTHER PUBLICATIONS

Anonymous, "Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

Arai, Y. et al., "A CMOS Four Channel x 1K Time Memory LSI with 1–ns/b Resolution", IEEE Journal of Solid–State Circuits, vol. 27, No. 3, M, 8107 Mar., 1992, No. 3, New York, US, pp. 359–364 and pp. 528–531.

Arai, Y. et al., "A Time Digitizer CMOS Gate–Array with a 250 ps Time Resolution", XP 000597207, IEEE Journal of Solid–State Circuits, vol. 31, No. 2, Feb. 1996, pp. 212–220.

Aviram, A. et al., "Obtaining High Speed Printing on Thermal Sensitive Special Paper With a Resistive Ribbon Print Head", IBM Technical Disclosure Bulletin, vol. 27, No. 5, Oct. 1984, pp. 3059–3060.

Bazes, M., "Two Novel Fully Complementary Self–Biased CMOS Differential Amplifiers", IEEE Journal of Solid–State Circuits, vol. 26, No. 2, Feb. 1991, pp. 165–168.

Chapman, J. et al., "A Low–Cost High–Performance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Donnelly, K. et al., "A 660 MB/s Interface Megacell Portable Circuit in 0.3 $\mu$m–0.7 $\mu$m CMOS ASIC", IEEE Journal of Solid–State Circuits, vol. 31, No. 12, Dec. 1996, pp. 1995–2001.

Goto, J. et al., "A PLL–Based Programmable Clock Generator with 50– to 350–MHz Oscillating Range for Video Signal Processors", IEICE Trans. Electron., vol. E77–C, No. 12, Dec. 1994, pp. 1951–1956.

Hamamoto, T., "400–MHz Random Column Operating SDRAM Techniques with Self–Skew Compensation", IEEE Journal of Solid–State Circuits, vol. 33, No. 5, May 1998, pp. 770–778.

Ishibashi, A. et al., "High–Speed Clock Distribution Architecture Employing PLL for 0.6$\mu$m CMOS SOG", IEEE Custom Integrated Circuits Conference, 1992, pp. 27.6.1–27.6.4.

Kim, B. et al., "A 30MHz High–Speed Analog/Digital PLL in 2$\mu$m CMOS", ISSCC, Feb. 1990.

Kikuchi, S. et al., "A Gate–Array–Based 666MHz VLSI Test System", IEEE International Test Conference, Paper 21.1, 1995, pp. 451–458.

Ko, U. et al., "A 30–ps Jitter, 3.6–µs Locking, 3.3–Volt Digital PLL for CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 625–629.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range," IEEE International Solid State Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "A 40–ns 64–Mb DRAM with 64–b Parallel Data Bus Architecture", IEEE Journal of Solid–State Circuits, vol. 26, No. 11, Nov. 1991, pp. 1493–1497.

Tanoi, S. et al., "A 250–622 MHz Deskew and Jitter–Suppressed Clock Buffer Using a Frequency– and Delay––Locked Two–Loop Architecture", 1995 Symposium on VLSI Circuits Digest of Technical Papers, vol. 11, No. 2, pp. 85–86.

Tanoi, S. et. al., "A 250–622 MHz Deskew and Jitter–Suppressed Clock Buffer Using Two–Loop Architecture", IEEE IEICE Trans. Electron., vol. E–79–C. No. 7, Jul. 1996, pp. 898–904.

von Kaenel, V. et al., "A 320 MHz, 1.5 mW @ 1.35 V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al. "A 622–Mb/s Bit/Frame Synchronizer for High–Speed Backplane Data Communication", IEEE Journal of Solid–State Circuits, vol. 31, No. 7, Jul. 1996, pp. 1063–1066.

Gustavsion, David B., et al., "IEEE Standard for Scalable Coherent Interface (SCI)," IEEE Computer Society, IEEE Std. 1596–1992, Aug. 2, 1993.

* cited by examiner

METHOD AND APPARATUS FOR GENERATING AN INTERNAL CLOCK SIGNAL THAT IS SYNCHRONIZED TO AN EXTERNAL CLOCK SIGNAL

CROSS-REFERENCE TO RELATED APPLICATION

This application is a continuation of U.S. patent application Ser. No. 08/798,226, filed Feb. 11, 1997, now U.S. Pat. No. 5,940,608.

TECHNICAL FIELD

This invention relates to clock circuits for generating a clock signal, and, more particularly, to a clock circuit for generating an internal clock signal for an integrated circuit that is synchronized to an external clock signal despite delays in coupling the external clock signal to the clock circuit.

BACKGROUND OF THE INVENTION

The preferred embodiment of the invention is specially adapted to solve an increasing problem in high-speed integrated circuits in which an externally applied clock is intended to be registered with other signals present in the integrated circuit. The external clock is frequently applied to a large number of circuits so that their operation can be synchronized to each other. As a result, the signal path to which the external clock signal is applied is capacitively loaded to a far greater degree than signal paths receiving other signals. As a result of this heavy capacitive loading, the external clock signal may be delayed significantly before it reaches the internal circuits in the integrated circuit. This delay may be so significant that the delayed external clock signal fails to be properly registered with other signals.

The above-described problem is exemplified by the integrated circuit 10 shown in FIG. 1. The integrated circuit 10 may be any of a wide variety of digital circuits including DRAMs, SRAMs, bus bridges, etc. that receives an external clock CLK signal and a data signal D, in addition to a large number of other signals which have been omitted for the purpose of brevity and clarity. The clock signal is coupled through a signal path 12 to a number of circuits 14a, 14b, 14n which use the clock signal for a variety of purposes. Once again, the circuits 14a–n can be any of a variety of circuits conventionally used in integrated circuits. The externally applied clock CLK signal is often used to synchronize the entire operation of the integrated circuit 10 and is thus typically routed to a large number of circuit nodes. As a result, the capacitive loading on the signal path 12 is relatively high. In particular, the capacitive loading on the signal path 12 will often be far higher than the capacitive loading on a data path 20 extending from an external terminal D to a far fewer number of signal nodes or to a single node which, in this example, is a NAND gate 22. As a result, there is relatively little delay of the data signal as it is coupled from the D terminal to the NAND gate 22 compared to the delay of the clock signal as it is coupled to the NAND gate 22 and the other circuits 14a–n. Because of this delay, the clock input to the NAND gate 22 is designated a delayed clock CLK-DEL.

The operation of the exemplary circuit 10 shown in FIG. 1 is best explained with further reference to the timing diagram of FIG. 2. As shown in FIG. 2, the leading edge of the external clock CLK signal is aligned with the leading edge of the data signal applied to the D terminal, although the data signal has only a 25% duty cycle. It is common for the data signal to be synchronized to the clock CLK signal before being applied to the integrated circuit 10 because the clock CLK signal may have been used to clock the data out of another integrated circuit (now shown). Primarily because of the capacitive loading of the signal path 12, the delayed clock CLK-DEL signal coupled to the NAND gate 22 is delayed by one-quarter of a clock period, or 90°, as illustrated by the third waveform of the timing diagram. As a result, by the time the CLK-DEL signal has gone high, the data signal has gone low so that the output OUT signal remains high. Thus, because of the delay of the external clock, the external clock signal is ineffective in clocking the data through the NAND gate 22.

As clock speeds continue to increase, timing tolerances have become increasingly severe. This problem is exacerbated by the increasing complexity in contemporary integrated circuits which require a large number of events to be accurately timed with respect to each other. These timing constraints threaten to create a significant road block to increasing the operating speeds of many conventional integrated circuits.

SUMMARY OF THE INVENTION

The inventive clock generator is adapted for use in an integrated circuit in which an external clock is coupled to a plurality of internal circuits with significant delays that impair the operation of at least some of the internal circuits. The integrated circuit may be a dynamic random access memory or some other digital circuit. The clock generator uses the delayed external clock signal to generate an internal clock signal that is synchronized to the undelayed external clock signal. The clock generator generates the internal clock signal using a phase-lock loop which includes a phase detector receiving the delayed external clock signal and the internal clock signal. The phase detector determines the difference in phase between the delayed external clock signal and the internal clock signal. This phase comparison is then adjusted by a phase offset corresponding to the difference between the phase of the external clock signal and the phase of the delayed external clock signal. The adjusted phase comparison is then used to control the frequency and phase of the internal clock signal so that the phase of the internal clock signal is substantially the same as the phase of the external clock signal. In addition to the phase detector, the phase-lock loop preferably includes a voltage controlled oscillator ("VCO") generating the internal clock signal at a frequency determined by a frequency control signal, and a loop filter generating the frequency control signal from a signal corresponding to the adjusted phase comparison. The clock circuit may also include a storage device storing data indicative of one of a plurality of predetermined frequency ranges of the external clock signal. The stored data is then used to cause the VCO to operate in one of a plurality of discrete frequency bands corresponding, respectively, to the predetermined frequency ranges. As a result, the frequency and phase of the internal clock signal need only be controlled responsive to the adjusted phase comparison in a relatively narrow band of frequencies in the frequency range corresponding to the data from the storage device.

DETAILED DESCRIPTION OF THE INVENTION

Figure 3:
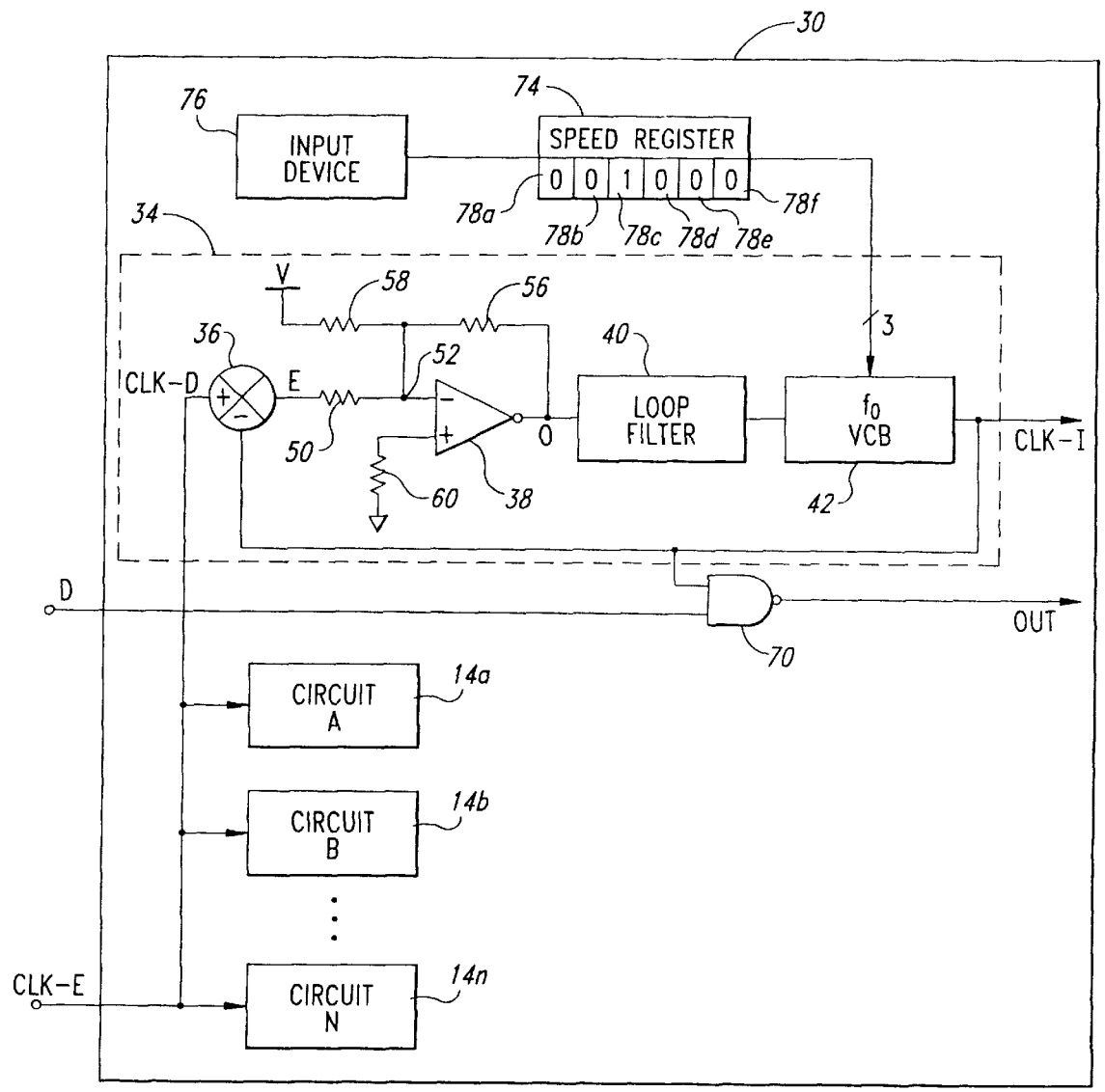
FIG. 3 is a block diagram and schematic of a preferred embodiment of the invention in which an internal clock signal is synchronized to an external clock signal despite significant delays in the external clock being coupled to a clock generator generating the internal clock signal.

The preferred embodiment of the invention is exemplified in an integrated circuit 30 shown in FIG. 3. As explained in detail below, the integrated circuit avoids the external clock delay problems of the prior art by creating an internal clock from the delayed external clock signal. Significantly, the phase of the internal clock signal is offset from the delayed external clock signal so that corresponding portions of the internal clock signal actually occur before the corresponding portions of the delayed external signal. This phase offset corresponds to the delay of the external signal as it is coupled to internal circuits so that the internal clock is substantially synchronized with the external clock.

Figure 1:
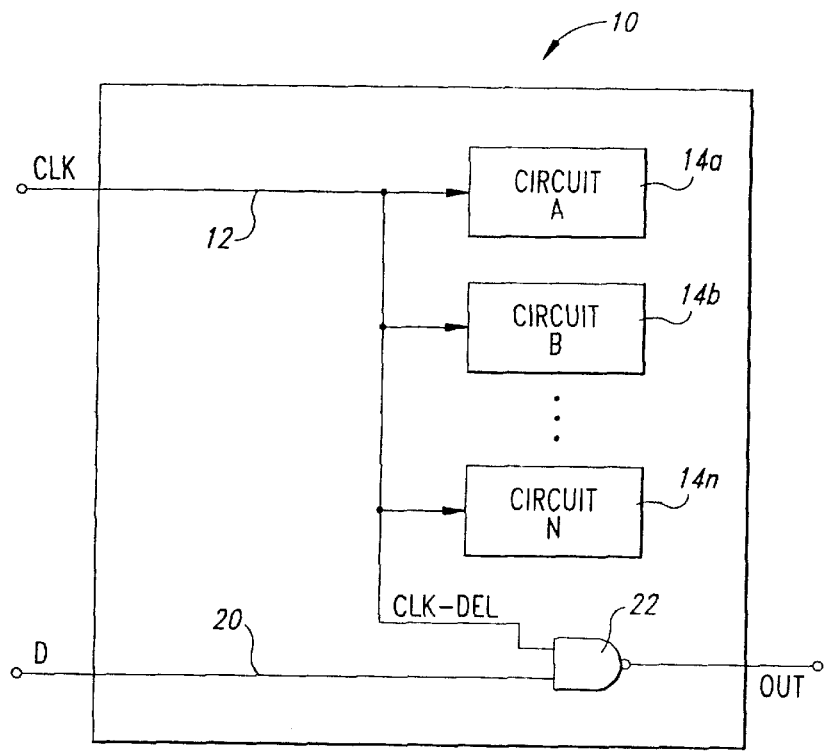
FIG. 1 is a block diagram of a prior art integrated circuit in which an external clock signal is excessively delayed while being coupled to a circuit using the external clock signal.
Figure 2:
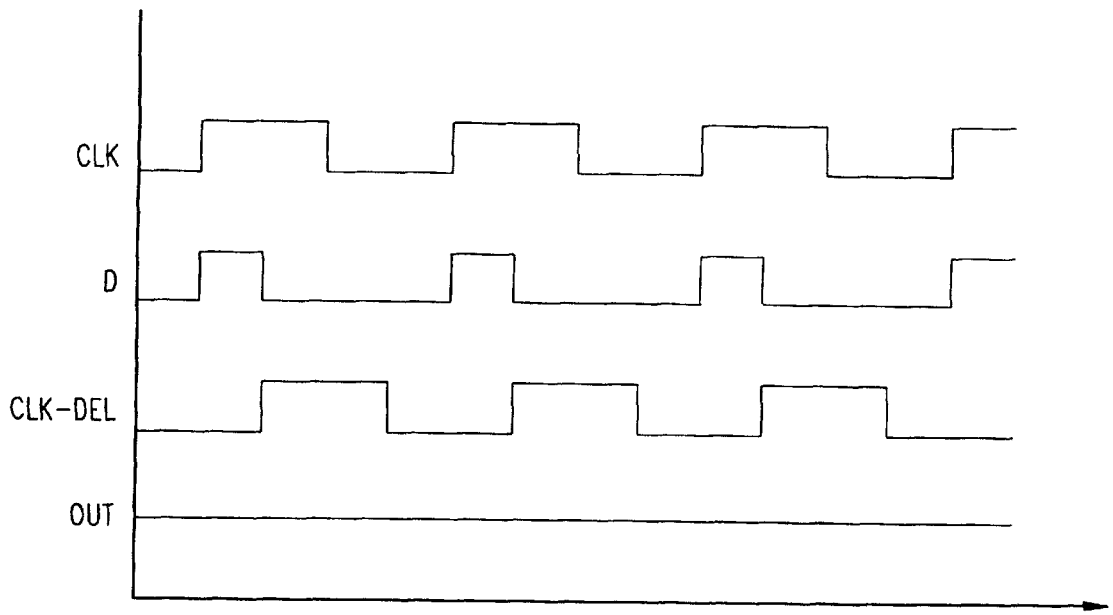
FIG. 2 is a timing diagram showing various signals present in the integrated circuit of FIG. 1.

With reference to FIG. 3, the external clock CLK-E signal is applied to the exemplary circuits 14a–n. As in the example of FIG. 1, the circuits 14a–n may be any of a wide variety of conventional or hereinafter developed circuits such as, for example, circuits commonly found in dynamic random access memories. In face, for purposes of this example, the integrated circuit 30 will be considered to be a dynamic random access memory device. The external clock CLK-E signal is also applied to a phase-lock loop 34 which includes a conventional phase detector 36, a conventional high gain differential amplifier 38, a loop filter 40, and a conventional VCO 42. The output of the voltage control oscillator is an internal clock CLK-I signal that is fed back to the phase detector 36. The phase detector 36 compares the phase of the delayed clock CLK-D signal with the phase of the internal clock CLK-I signal and generates a resulting error E signal corresponding to the phase difference. The error E signal is applied through a resistor 50 to a summing junction 52 of the differential amplifier 38. Also coupled to the summing junction 52 is a negative feedback signal coupled through resistor 56 from the output of the differential amplifier 38, and an offset voltage V applied through a resistor 58. The noninverting input of the differential amplifier 38 is coupled to ground through a resistor 60.

As is well known in the art, the differential amplifier 38 generates an output O signal that is proportional to the difference between the error E signal weighted by the ratio of the resistor 56 to the resistor 50 and the offset voltage V weighted by the ratio of the resistor 56 to the resistor 58. Thus, if the delayed clock CLK-D signal was synchronized to the internal clock CLK-I signal so that the error E signal was 0, the output of the differential amplifier 38 would be equal to the weighted value of the offset voltage V. However, when the output voltage of the differential amplifier 38 was substantially 0, the difference between the phase of the delayed clock CLK-D signal and the phase of the internal clock CLK-I signal would correspond to the weighted value of the offset voltage V. The significance of this characteristic will be subsequently apparent.

The output of the differential amplifier 38 is applied to a loop filter 40 which controls the loop dynamics of the phase-lock loop 34. The design of suitable loop filters 40 is well within the ability of those skilled in the art and will depend upon a variety of operating parameters.

The output of the loop filter 40 is applied to a frequency control input of the VCO 42 which generates the internal clock CLK-I signal. The frequency of the internal clock CLK-I signal is determined by the value of the voltage from the loop filter 40. The VCO 42 also includes a frequency band select signal $f_0$ which will be explained below but will be ignored for the present.

In operation, the gain of the phase-lock loop 34 is sufficient so that the frequency of the internal clock CLK-I signal is identical to the frequency of the delayed clock CLK-D signal, and the phase of the internal clock CLK-I signal is offset from the phase of the delayed clock CLK-D signal by a magnitude corresponding to the weighted offset voltage V. In other words, the gain of the phase-lock loop 34 is sufficient so that the VCO 42 will be adjusted so that the output of the differential amplifier 38 approaches 0 volts. As explained above, in order for the output of the differential amplifier 38 to be substantially 0, the weighted value of the error E signal must correspond to the weighted value of the offset voltage V. In order for the error E signal to have a large enough value to correspond to the offset voltage V, there must be a significant phase difference between the delayed clock CLK-D signal and the internal clock CLK-I signal. In operation, the weighted value of the offset voltage V is selected so that the phase difference in the signals applied to the phase detector 36 corresponds to the delay of the external clock CLK-E signal as it is coupled to the external circuitry, i.e., the phase difference between the CLK-E signal and the CLK-D signal.

Figure 4:
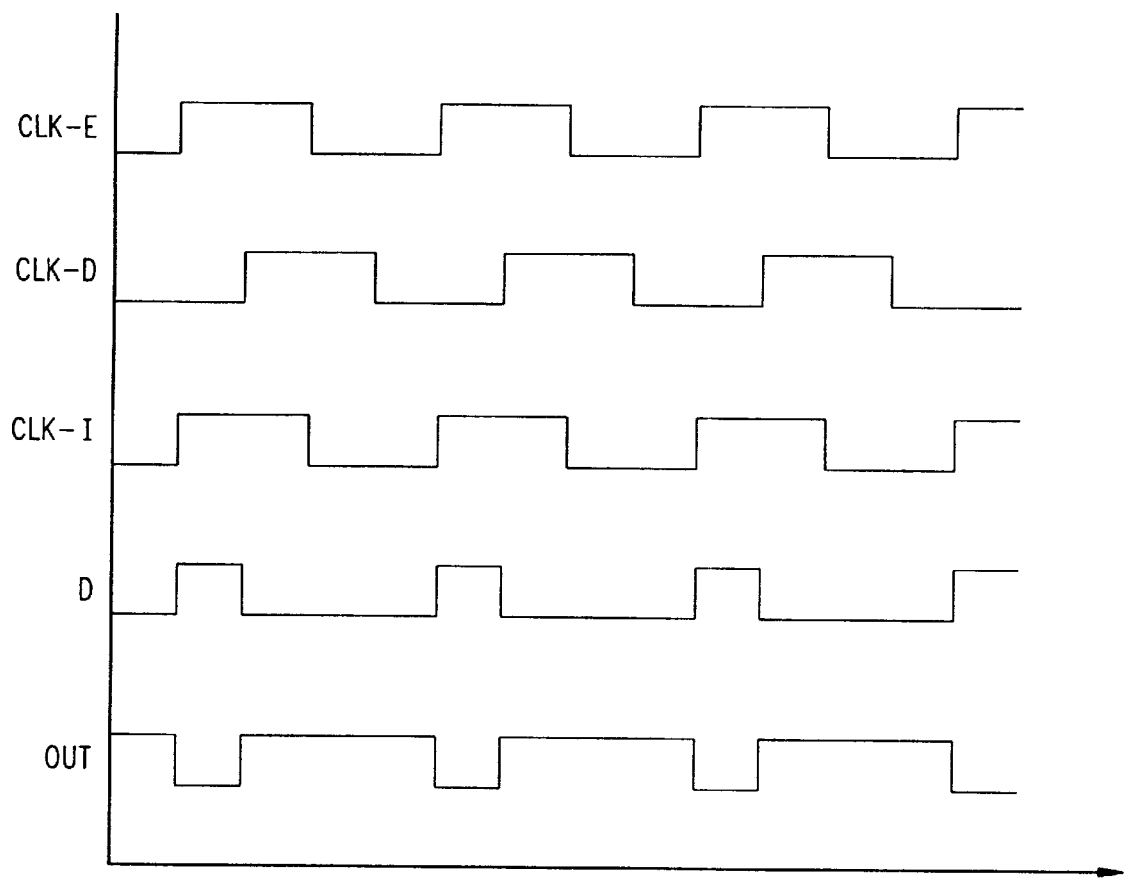
FIG. 4 is a timing diagram showing various signals present in the integrated circuit of FIG. 3.

The operation of the phase-lock loop 34 is best explained further with reference to the timing diagram of FIG. 4. As shown in FIG. 4, the external clock CLK-E signal is delayed by one-quarter clock period, or 90°, as it is coupled from the external terminal to the internal circuits 14a–n. Once again, the data signal is applied to the D terminal of the integrated circuit 30 and is coupled to a NAND gate 70. The NAND gate 70 is gated by the internal clock CLK-I signal from the VCO 42. Thus, as illustrated in FIG. 4, the internal clock CLK-I signal occurs one-quarter clock period or 90° before the delayed clock CLK-D signal so that the internal clock CLK-I signal is synchronized to the external clock CLK-E signal at the external terminals of the integrated circuit. As a result, the internal clock CLK-I signal is able to clock the entire data D signal through the NAND gate 70. Thus, the signal OUT at the output of the NAND gate 70 goes low during the entire portion of the data signal D.

In the event the frequency of the external clock CLK-E signal is expected to vary significantly, the VCO 42 should be constructed so that it is switched to operate in different frequency bands. By operating in different frequency bands or ranges, it is only necessary for the output of the loop filter 40 to tune the frequency of the internal clock CLK-I signal over a relatively narrow range, thereby minimizing "phase jitter." Phase jitter occurs from noise on the signal applied to the frequency control input of the VCO 42 from the loop filter 40. Basically, a larger change in VCO frequency output for a given change in control voltage will result in greater phase jitter when the phase-lock loop 34 is locked. By using a VCO 42 that operates in discrete frequency bands and using he control voltage to tune the frequency of the VCO 42 only within this band, he change in frequency for a given change in the control voltage can be relatively small. Voltage controlled oscillators 42 having these characteristics are conventional and well within the ability of those skilled in the art. The frequency band of the VCO 42 is selected by a data signal from a speed register 74 which contains data indicative of the frequency of the external clock signals CLK-E. The data may be loaded into the speed register 74 through a conventional input device 76, such as a keyboard. Alternatively, the data may be recorded in the speed register 74 by other means. Preferably, the speed register 74 includes a plurality of storage cells 78a–f corresponding to respective allowable frequencies of the external clock CLK-E signal. Only one of the storage cells 78C contains a bit, i.e., logic "1", designating its respective frequency as the frequency of the external clock CLK-E signal.

The preferred embodiment of the invention 30 illustrated in FIG. 3 is thus able to compensate for the significant delays of the external clock CLK-E signal as it is coupled through the integrated circuit 30.

From the foregoing it will be appreciated that, although specific embodiments of the invention have been described herein for purposes of illustration, various modifications may be made without deviating from the spirit and scope of the invention. For example, although the preferred embodiment of the invention uses a phase-lock look, it will be understood that other techniques may be used, including a delay-lock loop or some other means of generating an internal clock signal from the delayed external clock signal in which the phase of the internal clock signal is substantially the same as the external clock signal. Similarly, although the preferred embodiment of the invention has been explained for illustrative purposes as part of a synchronous or aesynchronous dynamic random access memory, it will be understood that it may be used as a part of other integrated circuit devices. Accordingly, the invention is not limited except as by the appended claims.

What is claimed is:

1. An integrated circuit to which an external clock signal is applied and which is adapted to receive a digital signal, the integrated circuit comprising:

an internal circuit for generating an internal clock signal, the internal circuit including a logic gate receiving the internal clock signal and the digital signal; and a clock circuit for generating the internal clock signal, the clock circuit comprising:

a locked loop generating the internal clock signal, the locked loop including a phase detector receiving the applied external clock signal and the internal clock signal and controlling the phase of the internal clock signal responsive to the difference in phase between the received external clock signal and the internal clock signal; and an offset circuit producing a predetermined offset between the phase of the internal clock signal and the phase of the received external clock signal when the locked loop is locked.

2. The integrated circuit of claim 1 wherein the predetermined offset comprises a phase corresponding to the difference between the phase of the external clock signal and the phase of the received external clock signal so that the phase of the internal clock signal is substantially the same as the phase of the applied external clock signal.

3. The integrated circuit of claim 1, wherein the locked loop comprises a phase-lock loop.

4. The integrated circuit of claim 3, wherein the clock circuit further comprising:

a storage device storing data indicative of one of a plurality of predetermined frequency ranges of the applied external clock signal; and a frequency band selector circuit adapted to cause the phase-lock loop to operate in one of a plurality of discrete frequency bands corresponding, respectively, to the predetermined frequency ranges, the frequency band selector circuit being coupled to the storage device to receive the frequency range data from the storage device and to operate the phase-lock loop in a frequency band corresponding to the data from the storage device.

5. The integrated circuit of claim 4, wherein the storage device comprises a programmable register, and wherein the clock circuit further comprises an input device adapted to input the frequency range data into the register.

6. The integrated circuit of claim 1, wherein the internal circuit of the integrated circuit comprises a dynamic random access memory circuit.

7. A method of generating an internal clock signal synchronized to an external clock signal that is coupled to a circuit in an integrated circuit, the external clock signal being delayed as it is coupled to the circuit so that the circuit receives a delayed external clock signal, the method comprising:

comparing the phase of the delayed external clock signal to the phase of the internal clock signal;

offsetting the comparison of the phase of the delayed external clock signal to the phase of the internal clock signal by a phase offset corresponding to the difference between the phase of the external clock signal and the phase of the delayed external clock signal;

generating as the internal clock signal a signal having a phase determined by the offset comparison between the phase of the delayed external clock signal and the phase of the internal clock signal;

storing data indicative of one of a plurality of predetermined frequency ranges of the external clock signal;

selecting one of a plurality of discrete frequency bands of the internal clock signal corresponding, respectively to the predetermined frequency ranges, the discrete frequency band being selected based on the stored frequency range data; and adjusting the phase and frequency of the internal clock signal within the selected frequency band as a function of the offset comparison between the phase of the delayed external clock signal and the phase of the internal clock signal.

8. The method of claim 7, wherein the circuits in the integrated circuit comprise dynamic random access memory circuits.

9. A method of generating an internal clock signal synchronized to an external clock signal that is coupled to a circuit in an integrated circuit, the external clock signal being delayed as it is coupled to the circuit so that the circuit receives a delayed external clock signal, the method comprising:

comparing the phase of the delayed external clock signal to the phase of the internal clock signal to produce a phase error signal having a magnitude corresponding to the phase comparison;

altering the magnitude of the phase error signal by a magnitude corresponding to the difference between the phase of the external clock signal and the phase of the delayed external clock signal;

generating as the internal clock signal a signal having a phase determined by the altered phase error signal;

storing data indicative of one of a plurality of predetermined frequency ranges of the external clock signal;

selecting one of a plurality of discrete frequency bands of the internal clock signal corresponding, respectively, to the predetermined frequency ranges, the discrete frequency band being selected based on the stored frequency range data; and adjusting the phase and frequency of the internal clock signal within the selected frequency band as a function of the altered phase error signal.

10. The method of claim 9, wherein the circuits in the integrated circuit comprise dynamic random access memory circuits.

11. A method of stobing a digital signal applied to an integrated circuit that also receives an external clock signal, the method comprising:

coupling the digital signal to a first internal circuit;

coupling the external clock signal to a second internal circuit, the external clock signal being delayed as it is coupled to the second internal circuit;

comparing the phase of the delayed external clock signal to the phase of an internal clock signal to produce a phase error signal having a magnitude corresponding to the phase comparison;

altering the magnitude of the phase error signal by a magnitude corresponding to the difference between the phase of the external clock signal and the phase of the delayed external clock signal;

generating as the internal clock signal a signal having a phase determined by the altered phase error signal; and applying the internal clock signal to the first internal circuit, the first internal circuit being operative to strobe the digital signal responsive to the internal clock signal.

12. The method of claim 11, wherein the first internal circuit comprises a logic gate.

13. The method of claim 11, further comprising:

storing data indicative of one of a plurality of predetermined frequency ranges of the external clock signal;

selecting one of a plurality of discrete frequency bands of the internal clock signal corresponding, respectively, to the predetermined frequency ranges, the discrete frequency band being selected based on the stored frequency range data; and adjusting the phase and frequency of the internal clock signal within the selected frequency band as a function of the altered phase error signal.

14. The method of claim 11, further comprising:

storing data indicative of one of a plurality of predetermined frequency ranges of the external clock signal;

selecting one of a plurality of discrete frequency bands of the internal clock signal corresponding, respectively, to the predetermined frequency ranges, the discrete frequency band being selected based on the stored frequency range data; and adjusting the phase and frequency of the internal clock signal within the selected frequency band as a function of the offset comparison between the phase of the delayed external clock signal and the phase of the internal clock signal.

15. A method of strobing a digital signal applied to an integrated circuit that also receives an external clock signal, the method comprising:

coupling the digital signal to an internal circuit;

comparing the phase of the external clock signal at a location within the integrated circuit to the phase of an internal clock signal to provide a phase error signal corresponding thereto;

providing a phase offset signal having a magnitude substantially corresponding to the delay of the external clock signal as it is coupled to the location within the integrated circuit;

summing the phase error signal and the phase offset signal to provide a control signal;

producing as the internal clock signal a signal having a phase corresponding to the control signal; and applying the internal clock signal to the internal circuit, the internal circuit being operative to strobe the digital signal responsive to the internal clock signal.

16. The method of claim 15 further comprising filtering the control signal prior to producing the signal having a phase corresponding to the control signal.

17. The method of claim 15 further comprising:

determining the frequency of the external clock signal; and selecting a band of frequencies for the internal clock signal as a function of the frequency of the external clock signal.

18. The method of claim 15 wherein the internal circuit comprises a logic gate.

19. In an integrated circuit to which an external clock signal is applied, a clock circuit for generating at an internal circuit an internal clock signal, the clock circuit comprising:

a locked loop generating the internal clock signal, the locked loop including a phase detector receiving the applied external clock signal and the internal clock signal and controlling the phase of the internal clock signal responsive to the difference in phase between the received external clock signal and the internal clock signal;

an offset circuit producing a predetermined offset between the phase of the internal clock signal and the phase of the received external clock signal when the locked loop is locked;

a storage device storing data indicative of one of a plurality of predetermined frequency ranges of the applied external clock signal; and a frequency band selector circuit adapted to cause the phase-lock loop to operate in one of a plurality of discrete frequency bands corresponding, respectively, to the predetermined frequency ranges, the frequency band selector circuit being coupled to the storage device to receive the frequency range data from the storage device and to operate the phase-lock loop in a frequency band corresponding to the data from the storage device.

20. The clock circuit of claim 19 wherein the predetermined offset comprises a phase corresponding to the difference between the phase of the external clock signal and the phase of the received external clock signal so that the phase of the internal clock signal is substantially the same as the phase of the applied external clock signal.

21. The clock circuit of claim 19, wherein the locked loop comprises a phase-lock loop.

22. The clock circuit of claim 21, wherein the storage device comprises a programmable register, and wherein the clock circuit further comprises an input device adapted to input the frequency range data into the register.

23. The clock circuit of claim 19, wherein the internal circuit of the integrated circuit comprises a dynamic random access memory circuit.

* * * * *